(12) United States Patent
Okubo et al.

(10) Patent No.: US 12,179,630 B2
(45) Date of Patent: Dec. 31, 2024

(54) DEGRADED STATE ESTIMATION APPARATUS FOR BATTERY

(71) Applicant: SUBARU CORPORATION, Tokyo (JP)

(72) Inventors: Yusuke Okubo, Tokyo (JP); Takahiro Ueki, Tokyo (JP); Tatsuya Ishibashi, Tokyo (JP); Isao Tsukui, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 219 days.

(21) Appl. No.: 17/726,680

(22) Filed: Apr. 22, 2022

(65) Prior Publication Data

US 2022/0371472 A1    Nov. 24, 2022

(30) Foreign Application Priority Data

May 24, 2021    (JP) .................................. 2021-086751

(51) Int. Cl.
*B60L 58/16*    (2019.01)
*B60L 3/00*    (2019.01)
(Continued)

(52) U.S. Cl.
CPC ............. *B60L 58/16* (2019.02); *B60L 3/0046* (2013.01); *B60L 58/12* (2019.02); *G01R 31/367* (2019.01);
(Continued)

(58) Field of Classification Search
CPC ........ B60L 58/16; B60L 3/0046; B60L 58/12; B60L 2240/545; B60L 2260/42; G01R 31/367; G01R 31/392; Y02E 60/10
(Continued)

(56) References Cited

U.S. PATENT DOCUMENTS

| 2003/0231006 A1* | 12/2003 | Tojima | G01R 31/392 |
| | | | 320/132 |
| 2004/0162683 A1* | 8/2004 | Verbrugge | G01R 31/367 |
| | | | 702/64 |

(Continued)

FOREIGN PATENT DOCUMENTS

| JP | 2004-022183 A | 1/2004 |
| JP | 2008-241246 A | 10/2008 |
| JP | 2013-044598 A | 3/2013 |

OTHER PUBLICATIONS

Office Action dated Nov. 19, 2024 issued in the corresponding Japanese Patent Application No. 2021-086751, w/ English Translation.

*Primary Examiner* — Tyler D Paige
(74) *Attorney, Agent, or Firm* — Rimon P.C.

(57) ABSTRACT

A degraded state estimation apparatus configured to estimate a degraded state of a battery mounted on a vehicle includes a detector, a storage, and an estimation processor. The detector detects state quantities including first, second, and third state quantities. The storage holds a maps of data including first and second maps of data. The first map of data indicates a degree of degradation of the battery based on the first and second state quantities. The second map of data indicates the degree of the degradation based on the second and third state quantities. The estimation processor estimates an amount of change in the degradation of the battery on the basis of the state quantities detected repetitively by the detector, the maps of data, and weighting coefficients each of which weights the degree of the degradation indicated by a corresponding one of the maps of data.

9 Claims, 7 Drawing Sheets

(51) Int. Cl.
   *B60L 58/12* (2019.01)
   *G01R 31/367* (2019.01)
   *G01R 31/392* (2019.01)

(52) U.S. Cl.
   CPC ...... *G01R 31/392* (2019.01); *B60L 2240/545* (2013.01)

(58) Field of Classification Search
   USPC .......................................................... 701/22
   See application file for complete search history.

(56) References Cited

U.S. PATENT DOCUMENTS

| | | | |
|---|---|---|---|
| 2010/0153038 A1* | 6/2010 | Tomura | G01R 31/3842 702/63 |
| 2014/0303915 A1* | 10/2014 | Jo | G01R 31/367 702/63 |
| 2016/0363632 A1* | 12/2016 | Park | G01R 31/3648 |
| 2017/0246963 A1* | 8/2017 | Lee | H01M 10/425 |
| 2018/0097396 A1* | 4/2018 | Qi | H01M 4/139 |
| 2018/0120385 A1* | 5/2018 | Choi | G01R 31/3648 |
| 2019/0207406 A1* | 7/2019 | Matthey | H02J 7/00309 |
| 2020/0062126 A1* | 2/2020 | Duan | B60L 58/25 |
| 2020/0355749 A1* | 11/2020 | Takahashi | H01M 10/0525 |

* cited by examiner

| V \ C | −150A | −50A | 0A | 100A | 200A |
|---|---|---|---|---|---|
| 2V | 3 | 2 | 2 | 2 | 3 |
| 3V | 2 | 1 | 1 | 1 | 2 |
| 3.7V | 2 | 1 | 0 | 1 | 2 |
| 3.9V | 2 | 1 | 1 | 1 | 2 |
| 4.1V | 3 | 2 | 2 | 2 | 3 |

FIG. 3A

| C \ T | −40°C | 0°C | 25°C | 40°C | 60°C |
|---|---|---|---|---|---|
| −150A | 3 | 2 | 2 | 2 | 3 |
| −50A | 2 | 1 | 1 | 1 | 2 |
| 0A | 2 | 1 | 0 | 1 | 2 |
| 100A | 2 | 1 | 1 | 1 | 2 |
| 200A | 3 | 2 | 2 | 2 | 3 |

FIG. 3B

| V \ T | −40°C | 0°C | 25°C | 40°C | 60°C |
|---|---|---|---|---|---|
| 2V | 3 | 2 | 2 | 2 | 3 |
| 3V | 2 | 1 | 1 | 1 | 2 |
| 3.7V | 2 | 1 | 0 | 1 | 2 |
| 3.9V | 2 | 1 | 1 | 1 | 2 |
| 4.1V | 3 | 2 | 2 | 2 | 3 |

| NUMBER OF CYCLES | CURRENT [A] | VOLTAGE [V] | TEMPE-RATURE [°C] | INTEGRATED VALUE A | INTEGRATED VALUE B | INTEGRATED VALUE C |
|---|---|---|---|---|---|---|
| ⋮ | ⋮ | ⋮ | ⋮ | ⋮ | ⋮ | ⋮ |
| 01500001 | −150 | 4.1 | 25 | 02250001 | 01865347 | 02433854 |
| 01500002 | −150 | 4.1 | 25 | 02250004 (=02250001+3) | 01865349 (=01865347+2) | 02433856 (=02433854+2) |
| 01500003 | −149.9 | 4.11 | 25 | 02250007 (=02250004+3) | 01865351 (=01865349+2) | 02433858 (=02433856+2) |
| ⋮ | ⋮ | ⋮ | ⋮ | ⋮ | ⋮ | ⋮ |
| 01800101 | −50 | 3.7 | −40 | 02722103 | 02250124 | 02920164 |
| 01800102 | −50 | 3.7 | −40 | 02722104 (=02722103+1) | 02250126 (=02250124+2) | 02920166 (=02920164+2) |
| 01800103 | −49.9 | 3.7 | −39.9 | 02722105 (=02722104+1) | 02250128 (=02250126+2) | 02920168 (=02920166+2) |
| ⋮ | ⋮ | ⋮ | ⋮ | ⋮ | ⋮ | ⋮ |
| 02100301 | 0 | 3.6 | 60 | 03132471 | 02675915 | 03342822 |
| 02100302 | 0 | 3.6 | 60 | 03132471 (=03132471+0) | 02675917 (=02675915+2) | 03342824 (=03342822+2) |
| 02100303 | 0.1 | 3.6 | 60.1 | 03132471 (=03132471+0) | 02675919 (=02675917+2) | 03342826 (=03342824+2) |
| ⋮ | ⋮ | ⋮ | ⋮ | ⋮ | ⋮ | ⋮ |

FIG. 5

| NUMBER OF TIMES OF PLUG-IN CHARGE | INTE-GRATED VALUE A | INTE-GRATED VALUE B | INTE-GRATED VALUE C | MEASURED VALUE OF AMOUNT OF DEGRA-DATION [%] | $\Delta SOH$ [%] | EQUATION | COEFFICIENT SOLUTIONS (a, b, c) |
|---|---|---|---|---|---|---|---|
| ... | ... | ... | ... | ... | ... | ... | ... |
| 51 | 182k | 99k | 300k | 2.221 | 0.020 | $0.020 = 182k \cdot a + 99k \cdot b + 300k \cdot c$ | (44.7n, 87.4n, 10.7n) |
| 52 | 260k | 136k | 420k | 2.249 | 0.028 | $0.028 = 260k \cdot a + 136k \cdot b + 420k \cdot c$ | (42.3n, 89.2n, 11.6n) |
| 53 | 465k | 258k | 724k | 2.300 | 0.051 | $0.051 = 465k \cdot a + 258k \cdot b + 724k \cdot c$ | (43.2n, 88.4n, 11.9n) |
| 54 | 426k | 212k | 688k | 2.345 | 0.045 | $0.045 = 426k \cdot a + 212k \cdot b + 688k \cdot c$ | (45.2n, 83.8n, 11.6n) |
| 55 | 111k | 69k | 198k | 2.358 | 0.013 | $0.013 = 111k \cdot a + 69k \cdot b + 198k \cdot c$ | (50.3n, 80.4n, 9.5n) |
| 56 | 243k | 117k | 358k | 2.383 | 0.025 | $0.025 = 243k \cdot a + 117k \cdot b + 358k \cdot c$ | (48.3n, 79.1n, 11.1n) |
| 57 | 298k | 147k | 447k | 2.414 | 0.031 | $0.031 = 298k \cdot a + 147k \cdot b + 447k \cdot c$ | (47.0n, 70.5n, 14.8n) |
| ... | ... | ... | ... | ... | ... | ... | ... |

DEGRADED STATE ESTIMATION APPARATUS FOR BATTERY

CROSS-REFERENCE TO RELATED APPLICATIONS

This application claims priority from Japanese Patent Application No. 2021-086751 filed on May 24, 2021, the entire contents of which are hereby incorporated by reference.

BACKGROUND

The technology relates to a degraded state estimation apparatus for a battery, configured to estimate a degraded state of the battery for travel.

Japanese Unexamined Patent Application Publication (JP-A) No. 2004-022183 discloses an apparatus that calculates a life consumption coefficient of a battery for travel, with the use of a plurality of maps of data. The plurality of the maps of data includes a map of data that indicates relation between a battery temperature in a case where a vehicle is stopped and a life coefficient, and a map of data that indicates relation between a battery current and the life coefficient. Moreover, the plurality of the maps of data further includes a map of data that indicates relation between the battery temperature in a case where the vehicle is traveling and the life coefficient, and a map of data that indicates relation between ΔSOC (State of Charge) and the life coefficient.

SUMMARY

An aspect of the technology provides a degraded state estimation apparatus for a battery mounted on a vehicle. The degraded state estimation apparatus is configured to estimate a degraded state of the battery for travel of the vehicle. The degraded state estimation apparatus includes a detector, a storage, and an estimation processor. The detector is configured to detect state quantities that indicating a state of use of the battery. The state quantities include a first state quantity, a second state quantity, and a third state quantity. The storage is configured to hold maps of data each of which indicates a degree of degradation of the battery based on one or more of the state quantities. The estimation processor is configured to estimate an amount of change in the degradation of the battery. The maps of data include a first map of data and a second map of data. The first map of data indicates the degree of the degradation of the battery based on the first state quantity and the second state quantity. The second map of data indicates the degree of the degradation of the battery based on the second state quantity and the third state quantity. The estimation processor is configured to estimate the amount of change in the degradation of the battery on the basis of the state quantities detected repetitively by the detector, the maps of data, and weighting coefficients each of which weights the degree of the degradation indicated by a corresponding one of the maps of data.

An aspect of the technology provides a degraded state estimation apparatus for a battery mounted on a vehicle. The degraded state estimation apparatus is configured to estimate a degraded state of the battery for travel of the vehicle. The degraded state estimation apparatus includes a detector, a storage, and circuitry. The detector is configured to detect state quantities indicating a state of use of the battery. The state quantities include a first state quantity, a second state quantity, and a third state quantity. The storage is configured to hold maps of data each of which indicates a degree of degradation of the battery based on one or more of the state quantities. The circuitry is configured to estimate an amount of change in the degradation of the battery. The maps of data include a first map of data and a second map of data. The first map of data indicates the degree of the degradation of the battery based on the first state quantity and the second state quantity. The second map of data indicates the degree of the degradation of the battery based on the second state quantity and the third state quantity. The circuitry is configured to estimate the amount of change in the degradation of the battery on the basis of the state quantities detected repetitively by the detector, the maps of data, and weighting coefficients each of which weights the degree of the degradation indicated by a corresponding one of the maps of data.

BRIEF DESCRIPTION OF THE DRAWINGS

The accompanying drawings are included to provide a further understanding of the technology and are incorporated in and constitute a part of this specification. The drawings illustrate example embodiments and, together with the specification, serve to explain the principles of the technology.

DETAILED DESCRIPTION

An amount of degradation of a battery, or an SOH (State of Health), is measured in a simple manner by, for example, charging the battery to full charge. Meanwhile, it would be useful if the SOH of a battery is estimated at any timing, for example, after using the battery and before charging the battery. However, existing estimation methods as described in JP-A No. 2004-022183 have room for improvements in terms of estimation accuracy.

It is desirable to provide a degraded state estimation apparatus for a battery that makes it possible to estimate a degraded state of the battery at any timing and improve estimation accuracy.

In the following, some example embodiments of the technology are described in detail with reference to the accompanying drawings. Note that the following description is directed to illustrative examples of the disclosure and not to be construed as limiting to the technology. Factors including, without limitation, numerical values, shapes, materials, components, positions of the components, and how the components are coupled to each other are illustrative only and not to be construed as limiting to the technology.

Further, elements in the following example embodiments which are not recited in a most-generic independent claim of the disclosure are optional and may be provided on an as-needed basis. The drawings are schematic and are not intended to be drawn to scale. Throughout the present specification and the drawings, elements having substantially the same function and configuration are denoted with the same reference numerals to avoid any redundant description. In addition, elements that are not directly related to any embodiment of the technology are unillustrated in the drawings.

Figure 1:
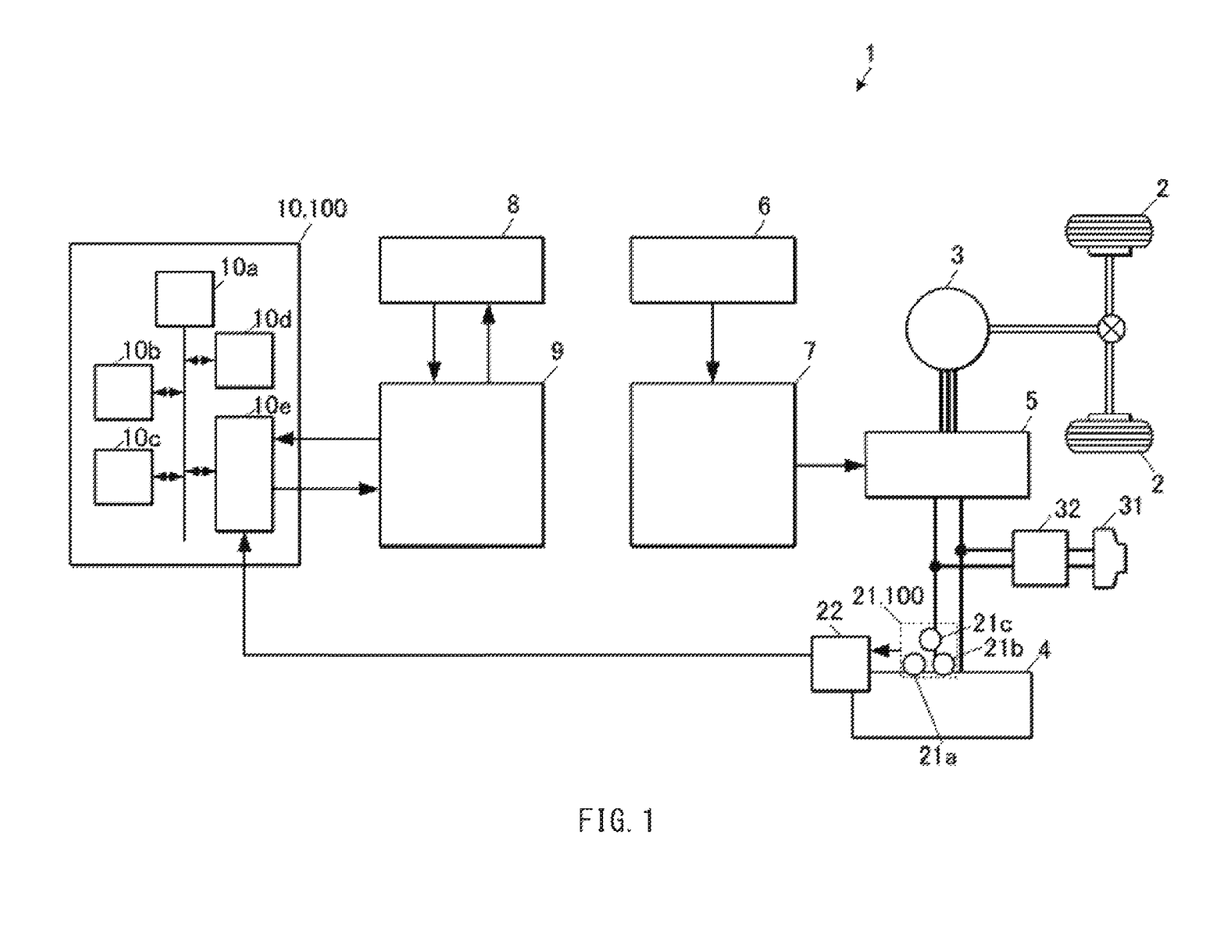
FIG. 1 is a block diagram of an example of a vehicle on which a degraded state estimation apparatus for a battery according to an embodiment of the disclosure is mounted.
Figure 2:
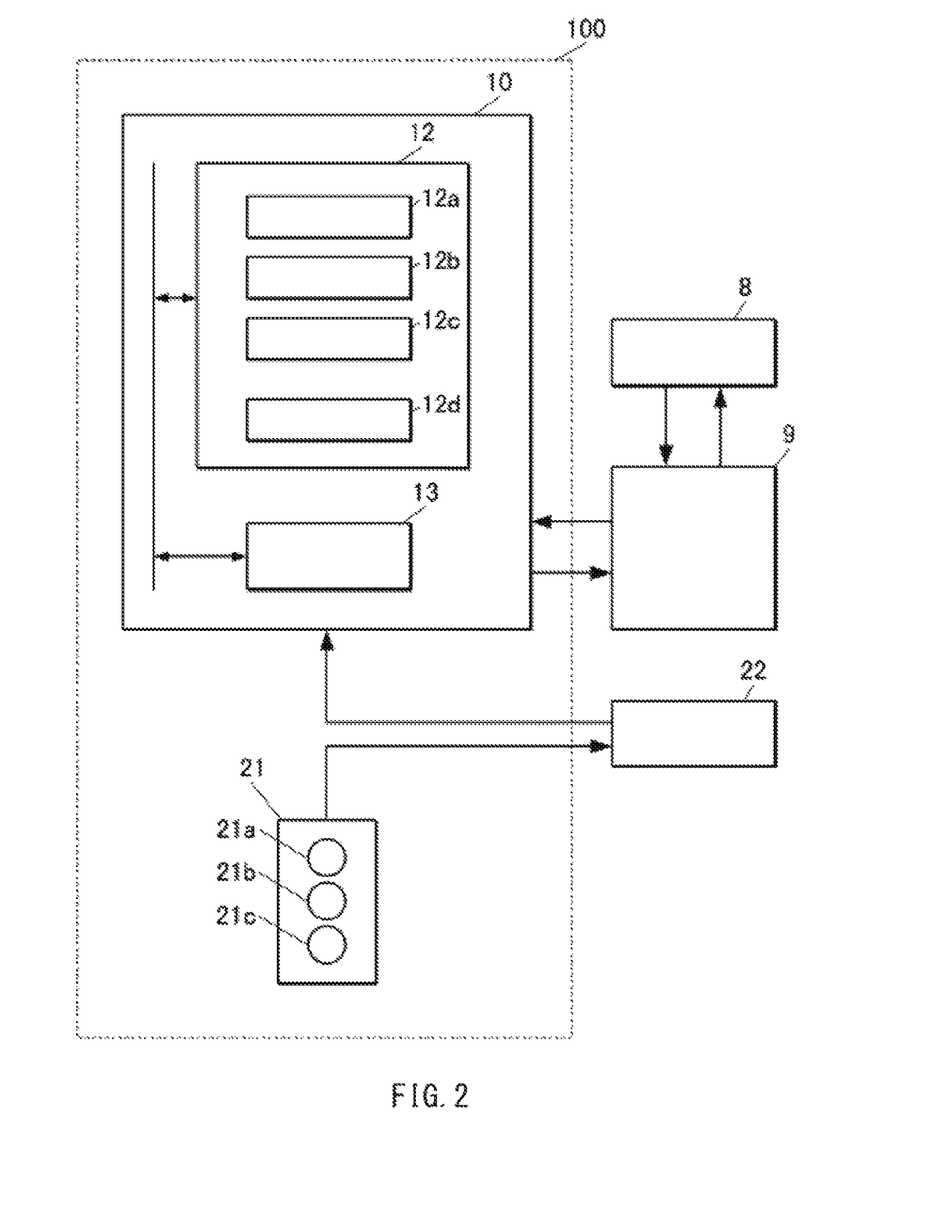
FIG. 2 is a block diagram of the degraded state estimation apparatus.

FIG. 1 is a block diagram of an example of a vehicle on which a degraded state estimation apparatus for a battery according to an embodiment of the disclosure is mounted. FIG. 2 is a block diagram of the degraded state estimation apparatus.

As illustrated in FIG. 1, a vehicle 1 may include, for example, an EV (Electric Vehicle). The vehicle 1 may include, without limitation, driving wheels 2, an electric motor 3, and a battery 4 for travel. The electric motor 3 may generate motive power for travel to be outputted to the driving wheels 2. The battery 4 may accumulate electric power to be supplied to the electric motor 3. Moreover, the vehicle 1 may further include, without limitation, an inverter 5, a driving operation unit 6, and a driving controller 7. The inverter 5 may convert and transmit electric power between the battery 4 and the electric motor 3. The driving operation unit 6 may accept a driving operation by a driver. The driving controller 7 may receive an operation signal from the driving operation unit 6 and control the inverter 5. Furthermore, the vehicle 1 may further include, without limitation, a display panel 8 and a controller 9 for user interface. The display panel 8 may provide a user with an output of information and allows the user to make an input of information. The controller 9 may make an information exchange control with the user through the display panel 8.

In addition, the vehicle 1 may include, without limitation, a detector 21, a battery manager 22, and a calculation device 10. The detector 21 detects a plurality of state quantities that indicates a state of use of the battery 4. The battery manager 22 may make management of the battery 4. The calculation device 10 may estimate a degraded state of the battery 4. The detector 21 and the calculation device 10 may serve as a degraded state estimation apparatus 100 according to this embodiment.

The battery 4 may include, for example, a lithium ion secondary battery or a nickel hydrogen secondary battery. There is no particular limitation on a kind of the battery 4 as long as the battery 4 is able to accumulate electric power for travel by charge.

The inverter 5 may bring the electric motor 3 to powering operation and regenerative operation in accordance with a travel situation and a driving operation. In a typical example, the inverter 5 may bring the electric motor 3 to the powering operation, causing discharge of the battery 4. The inverter 5 may bring the electric motor 3 to the regenerative operation, causing a regenerative current to be sent to the battery 4, and causing the battery 4 to be charged. A current value of the battery 4 may be expressed as a positive value on the occasion of the discharge, and as a negative value on the occasion of the charge.

The detector 21 is configured to detect constantly and repetitively the plurality of the state quantities that indicates the state of use of the battery 4. The plurality of the state quantities may include, without limitation, a temperature of the battery 4, a voltage of the battery 4, and a current of the battery 4. The detector 21 may include, without limitation, a temperature sensor 21a, a voltage sensor 21b, and a current sensor 21c. A detected value of each of the state quantities detected by the detector 21 may be sent to the calculation device 10 through the battery manager 22. In one embodiment of the technology, the temperature, the voltage, and the current of the battery 4 may serve as a "first state quantity", a "second state quantity", and a "third state quantity" in random order.

In this embodiment, the voltage of the battery 4 to be detected by the voltage sensor 21b may be a voltage of a representative one of a plurality of battery cells that constitutes the battery 4. However, the voltage of the battery 4 to be detected by the voltage sensor 21b may be a voltage of each of the plurality of the battery cells, or a total voltage of the battery 4.

The battery manager 22 may integrate the current value of the battery 4, to calculate an SOC (State of Charge) of the battery 4 constantly while the battery 4 is in use. The battery manager 22 may hold data regarding initial capacity of the battery 4. In a case where the battery 4 is charged, the battery manager 22 may measure the SOH of the battery 4 on the basis of the SOC of the battery 4 at a full charge voltage and the initial capacity as mentioned above.

The vehicle 1 may further include, without limitation, a charging port 31 and an on-board charger 32. The charging port 31 is provided for taking electric power from outside the vehicle 1. The on-board charger 32 may charge the battery 4 with the use of electric power taken from the charging port 31. The charging port 31 is configured to be coupled to a charging cable that guides electric power from a power supply outside the vehicle 1. Charging the battery 4 through the charging port 31 is referred to as "plug-in charge".

As illustrated in FIG. 1, the calculation device 10 may include, without limitation, an ECU (Electronic Control Unit). The ECU may include, without limitation, a CPU (Central Processing Unit) 10a, a RAM (Random Access Memory) 10b, a ROM (Read Only Memory) 10c, a non-volatile storage unit 10d, and an interface 10e. The CPU 10a may perform calculation processing. The CPU 10a may expand data in the RAM 10b. The ROM 10c may hold a control program to be executed by the CPU 10a. The interface 10e may transmit and receive signals between the CPU 10a and external devices of the calculation device 10. The calculation device 10 may include a single ECU, or alternatively, the calculation device 10 may include a plurality of ECUs that communicates with one another and operates in cooperation with one another.

As illustrated in FIG. 2, the calculation device 10 may include, without limitation, a storage 12 and an estimation processor 13. The storage 12 is configured to hold a plurality of maps of data 12a to 12c. The plurality of the maps of data 12a to 12c indicates relation between the plurality of the state quantities to be detected by the detector 21 and a degree of degradation of the battery 4. The estimation processor 13 is configured to estimate an amount of change in the degradation of the battery 4. In FIG. 2, the contents of the calculation device 10 are represented by blocks. The estimation processor 13 may include the CPU 10a executing a control program. The storage 12 may include an area of the ROM 10c and/or an area of the non-volatile storage unit 10d. The storage 12 may further include, without limitation, a storage area 12d in which log data for estimation of the amount of change in the degradation of the battery 4 is held. The amount of change in the degradation of the battery 4 means a difference between an amount of the degradation of the battery 4, or the SOH, at certain timing and the amount of the degradation of the battery 4 at other timing. The amount of the degradation at certain timing means a ratio of full charge capacity of the battery 4 at the relevant timing to initial full charge capacity of the battery 4. Hereinafter, the amount of change in the degradation is also referred to as "ΔSOH".

<Maps of Data>

Figure 3A:
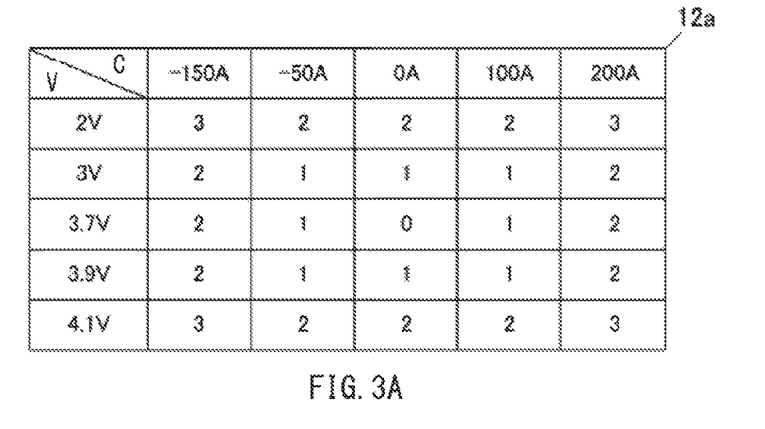
FIG. 3A is a table that illustrates an example of an IV map of data held in a storage.
Figure 3B:
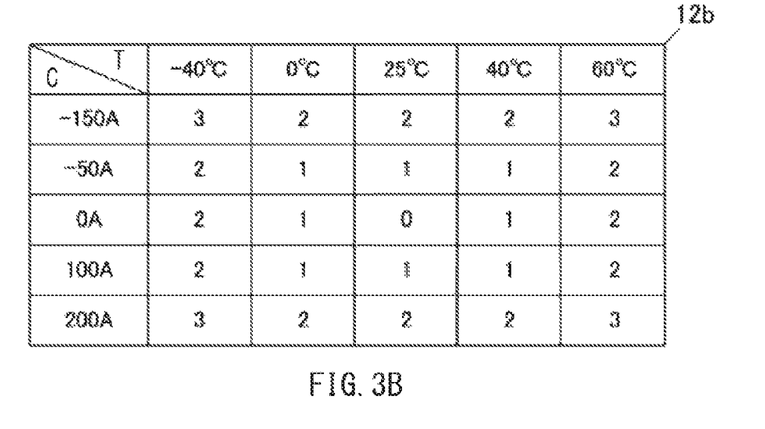
FIG. 3B is a table that illustrates an example of a TI map of data held in the storage.
Figure 3C:
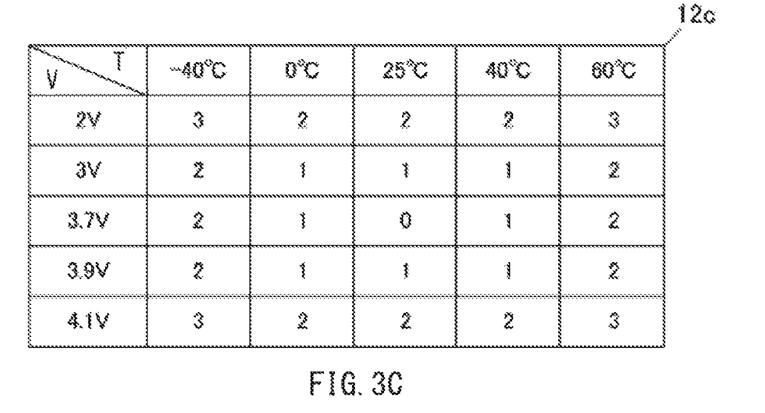
FIG. 3C is a table that illustrates an example of a TV map of data held in the storage.

FIGS. 3A to 3C illustrate examples of an IV map of data, a TI map of data, and a TV map of data held in the storage, respectively. The plurality of the maps of data held in the storage 12 includes, without limitation, an IV map of data 12a and a TI map of data 12b. The IV map of data 12a may indicate the degrees of the degradation of the battery 4 corresponding to the voltage and the current of the battery 4. The TI map of data 12b may indicate the degrees of the degradation of the battery 4 corresponding to the current and the temperature of the battery 4. Moreover, the plurality of the map of data held in the storage 12 may further include, without limitation, a TV map of data 12c. The TV map of data 12c may indicate the degrees of the degradation corresponding to the voltage and the temperature of the battery 4. In one embodiment of the technology, any two of the three maps of data 12a to 12c may serve as a "first map of data" and a "second map of data", and the remaining one may serve as a "third map of data". In this embodiment, description is given of a case with the three maps of data 12a to 12c, but the calculation device 10 may include only two of the maps of data as mentioned above, or may further include other additional maps of data.

As illustrated in FIG. 3A, in the IV map of data 12a, each row is associated with a voltage value. Each column is associated with a current value. Each box indicates the degree of the degradation of the battery 4 in a case where the voltage value and the current value associated with the relevant row and column are generated. In FIG. 3A, the current values associated with the respective columns of the IV map of data 12a each indicate a single value such as "0 A" and "100 A", but they each mean a range of current values such as "from −25 A inclusive to 25 A exclusive" and "from 25 A inclusive to 150 A exclusive". Similarly, the voltage values associated with the respective rows of the IV map of data 12a each mean a range. In FIG. 3A, the IV map of data 12a includes data of five rows and five columns, but the IV map of data 12a may include data of more rows and columns, and the current ranges and the voltage ranges may be more subdivided.

The degrees of the degradation summarized in the IV map of data 12a each represent the degree of the degradation per unit time. It suffices that the degrees of the degradation indicate their relative magnitude relation in the IV map of data 12a. The values of the degrees of the degradation may be standardized. The standardization may be any kind of standardization such as, for example, standardization in which a maximum value and a minimum value take respective predetermined values, or standardization in which an average value of the degrees of the degradation of all the boxes takes a predetermined value.

The IV map of data 12a may be created, for example, by obtaining, by testing or simulation, the amount of the degradation per unit time on various conditions of use, with the current and the voltage varied. It is to be noted that the amount of the degradation of the battery 4 is influenced by other state quantities than the current and the voltage, e.g., the temperature. Accordingly, in creating the IV map of data 12a, the testing or the simulation may be carried out, with representative values selected for other state quantities, to determine the degrees of the degradation in the IV map of data 12a on the basis of a result of the testing or the simulation. Alternatively, the testing or the simulation may be carried out, with a plurality of the representative values selected for each of other state quantities, to determine the degrees of the degradation in the IV map of data 12a on the basis of statistics, e.g., average values, of the result of the testing or the simulation.

In the example in FIG. 3A, the degree of the degradation is low in a case where the voltage and the current are both intermediate values (3.7 V, 0 A), and the degree of the degradation becomes higher as the voltage and the current go away from the intermediate values in both positive and negative directions. This is a simplified example. Depending on, for example, a structure or characteristics of the battery 4, the IV map of data 12a may sometimes include a gradient of the degree of the degradation that differs from that illustrated in FIG. 3A, or alternatively, the degree of the degradation may increase steeply with a particular combination of the voltage value and the current value.

The TI map of data 12b in FIG. 3B and the TV map of data 12c in FIG. 3C are similar to the IV map of data 12a except that the state quantities of interest are replaced with, respectively, the temperature and the current, and the temperature and the voltage.

<Processing in Estimation Processor>

Figure 4:
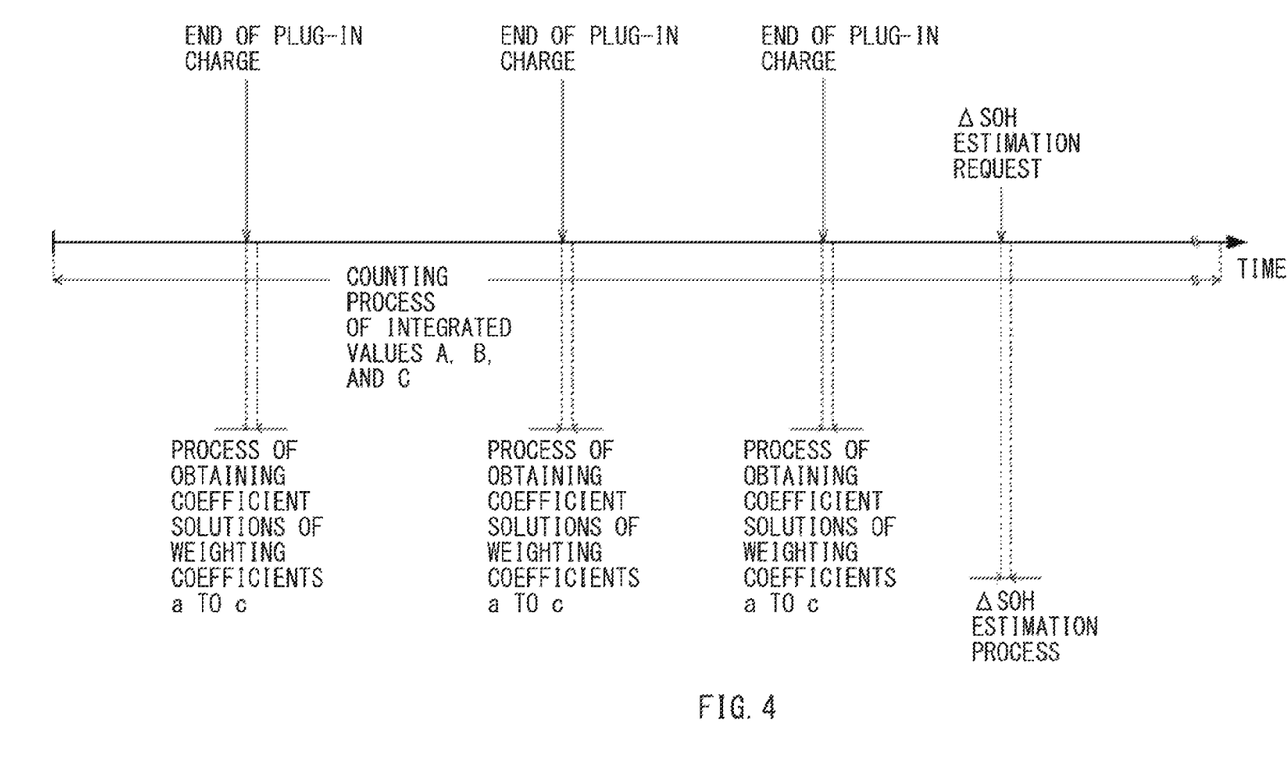
FIG. 4 is a time chart that illustrates processing in an estimation processor.

FIG. 4 is a time chart that illustrates processing in the estimation processor. The estimation processor 13 is configured to perform a process of counting integrated values A to C of the degree of the degradation, a process of obtaining coefficient solutions of weighting coefficients a to c of the degree of the degradation, and an estimation process of ΔSOH of the battery 4.

The counting process of the integrated values A to C may be carried out constantly and repetitively on short cycles. The process of obtaining the coefficient solutions of the weighting coefficients a to c may be carried out on the occasion of measurement of the amount of the degradation of the battery 4, e.g., at an end of the plug-in charge. The ΔSOH estimation process may be carried out at an estimation request at any timing. In the following, these processes are described in detail.

<Counting Process of Integrated Values A to C>

Figure 5:
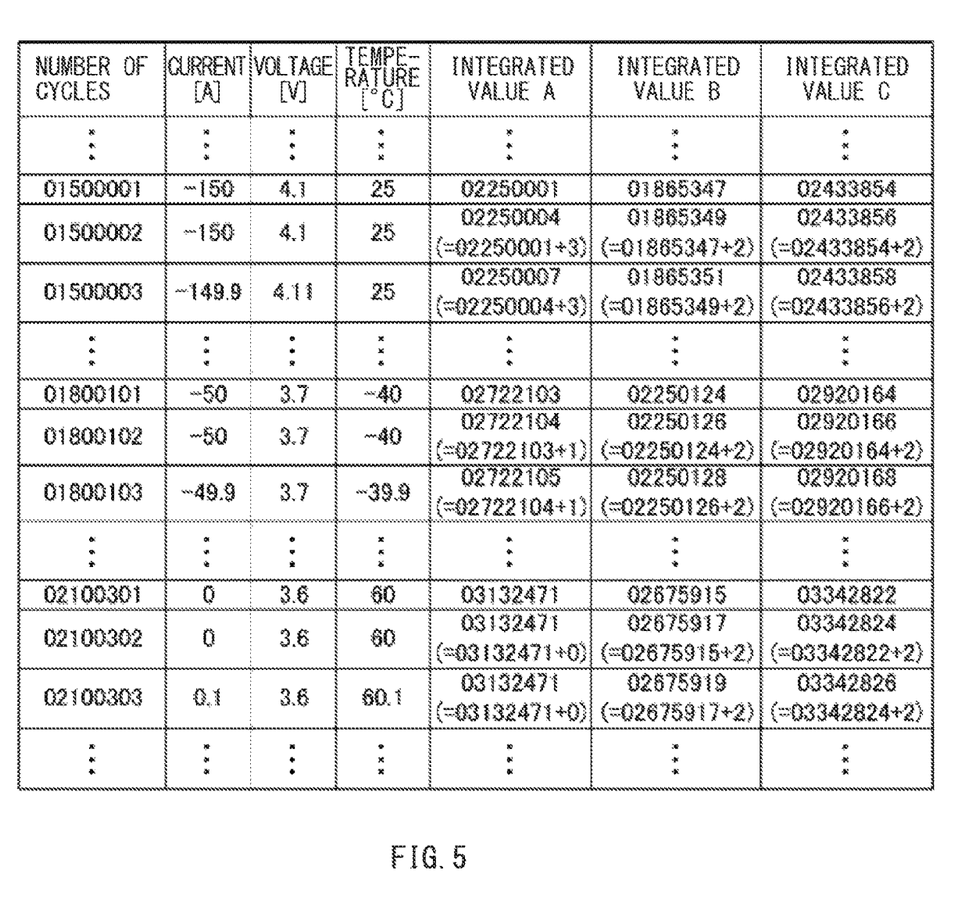
FIG. 5 is a data chart that illustrates a counting process of integrated values A to C to be carried out by the estimation processor.

FIG. 5 is a data chart that illustrates the counting process of the integrated values A to C to be carried out by the estimation processor. The integrated values A to C are values obtained by integrating the degrees of the degradation extracted from respective ones of the maps of data 12a to 12c. The integration of the degree of the degradation may be carried out for each of the maps of data 12a to 12c as follows.

The detector 21 may constantly detect the plurality of the state quantities of the battery 4 for each predetermined sampling period of, for example, 0.1 ms to 100 ms. The detector 21 may send the detected values of the plurality of the state quantities to the estimation processor 13 through the battery manager 22. Upon receiving the detected values of the plurality of the state quantities, the estimation processor 13 may extract the degree of the degradation corresponding to the plurality of the state quantities from each of the plurality of the maps of data 12a to 12c. Thus, the estimation processor 13 may add the extracted degrees of the degradation to respective ones of the integrated values A to C calculated in an immediately preceding cycle. With such processing, a value obtained by integrating the degree of the degradation in the IV map of data 12a may be stored in a storage area of the integrated value A. Likewise, a value obtained by integrating the degree of the degradation in the TI map of data 12b may be stored in a storage area of the integrated value B. Likewise, a value obtained by integrating the degree of the degradation in the TV map of data 12c may be stored in a storage area of the integrated value C.

The data chart in FIG. 5 is a chart of time-series arrangement of data regarding a plurality of processing cycles related to the counting process of the integrated values A to C. One processing cycle corresponds to one sampling period of the detector 21. In the example in FIG. 5, for example, at the number of cycles "01800102", the current value of −50 [A], the voltage value of 3.7 [V], and the temperature of −40 [° C.] are detected in the detector 21. Referring to the IV map of data 12a, the TI map of data 12b, and the TV map of data 12c in FIGS. 3A to 3C, the degrees of the degradation corresponding to these detected values are "1", "2", and "2", respectively. The estimation processor 13 may extract these degrees of the degradation. The estimation processor 13 may add the extracted degrees of the degradation to the integrated value A "02722103", the integrated value B "02250124", and the integrated value C "02920164" at the previous number of cycles. As a result, the updated integrated value A "02722104", the updated integrated value B "02250126", and the updated integrated value C "02920166" are counted. Such a counting process of the integrated values A to C may be carried out constantly and continuously.

It is to be noted that the integrated values A to C may be configured to be reset on the basis of occurrence of a predetermined event or an end of the predetermined event, allowing the integrated values A to C immediately before the reset to be recorded together with event data.

As mentioned above, the values of the degrees of the degradation summarized in the maps of data 12a to 12c may be standardized. This inhibits the amount of the degradation of the battery 4 from being represented solely by the values of the degrees of the degradation. The values of the degrees of the degradation summarized in each of the plurality of the map of data 12a to 12c may be multiplied by the weighting coefficients a to c. This multiplication allows for conversion of the values of the degrees of the degradation into values corresponding to the amount of the degradation of the battery 4, making the degrees of the degradation comparable between the different maps of data 12a to 12c. In one embodiment of the technology, the weighting coefficients a to c may serve as a "first coefficient", a "second coefficient", and a "third coefficient" in random order.

For this reason, the estimation processor 13 may multiply the integrated values A to C of the degrees of the degradation in the plurality of the maps of data 12a to 12c by the weighting coefficients a to c, respectively. Moreover, the estimation processor 13 may perform data processing, assuming that a sum of the multiplied values approximates to ΔSOH of the battery 4. That is, in a case with the use of the three maps of data 12a to 12c, the estimation processor 13 may perform the data processing on the assumption that the following equation (1) holds:

$$\Delta SOH = A \times a + B \times b + C \times c \quad (1)$$

In the equation (1), "ΔSOH" denotes ΔSOH from any first timing to any second timing. The integrated values "A" to "C" denote integrated values of the degrees of the degradation from the first timing to the second timing.

In a case with the use of more maps of data, ΔSOH may be expressed by a relational expression as follows. The estimation processor 13 may multiply the integrated value of the degrees of the degradation in each map of data by a weighting coefficient corresponding to the degree of the degradation in each map of data. The estimation processor 13 may use an expression in which a value obtained by summing the multiplied values for all the maps of data is equal to ΔSOH of the battery 4.

The estimation processor 13 may constantly count the integrated values A to C. Accordingly, once the values of the weighting coefficients a to c are determined, the estimation processor 13 is able to obtain an estimated value of ΔSOH of the battery 4 using the equation (1).

On the other hand, weighting with which the degrees of the degradation summarized in the plurality of the maps of data 12a to 12c act on the amount of the degradation of the battery 4 may gradually change depending on, for example, the use of the battery 4 up to the time point or aging of the battery 4. Thus, the estimation processor 13 may estimate and set the weighting coefficients a to c in conformity with the state of the battery 4, instead of making the weighting coefficients a to c fixed values.

<Process of Obtaining Coefficient Solutions of Weighting Coefficients a to c>

In the vehicle 1, the amount of the degradation of the battery 4, i.e., the SOH, may be measured on the occasion of the plug-in charge. Accordingly, ΔSOH may be calculated on the basis of a measured value of the amount of the degradation on the occasion of the previous plug-in charge and a currently measured value of the amount of the degradation. Furthermore, the estimation processor 13 may constantly count the integrated values A to C. Thus, the estimation processor 13 may apply the calculated ΔSOH and the counted integrated values A to C to the equation (1), to obtain an equation having the weighting coefficients a to c as unknowns. The estimation processor 13 may acquire the equation as mentioned above, each time the amount of the degradation of the battery 4 is measured on the occasion of the plug-in charge. The estimation processor 13 may record the equation acquired.

Figure 6:
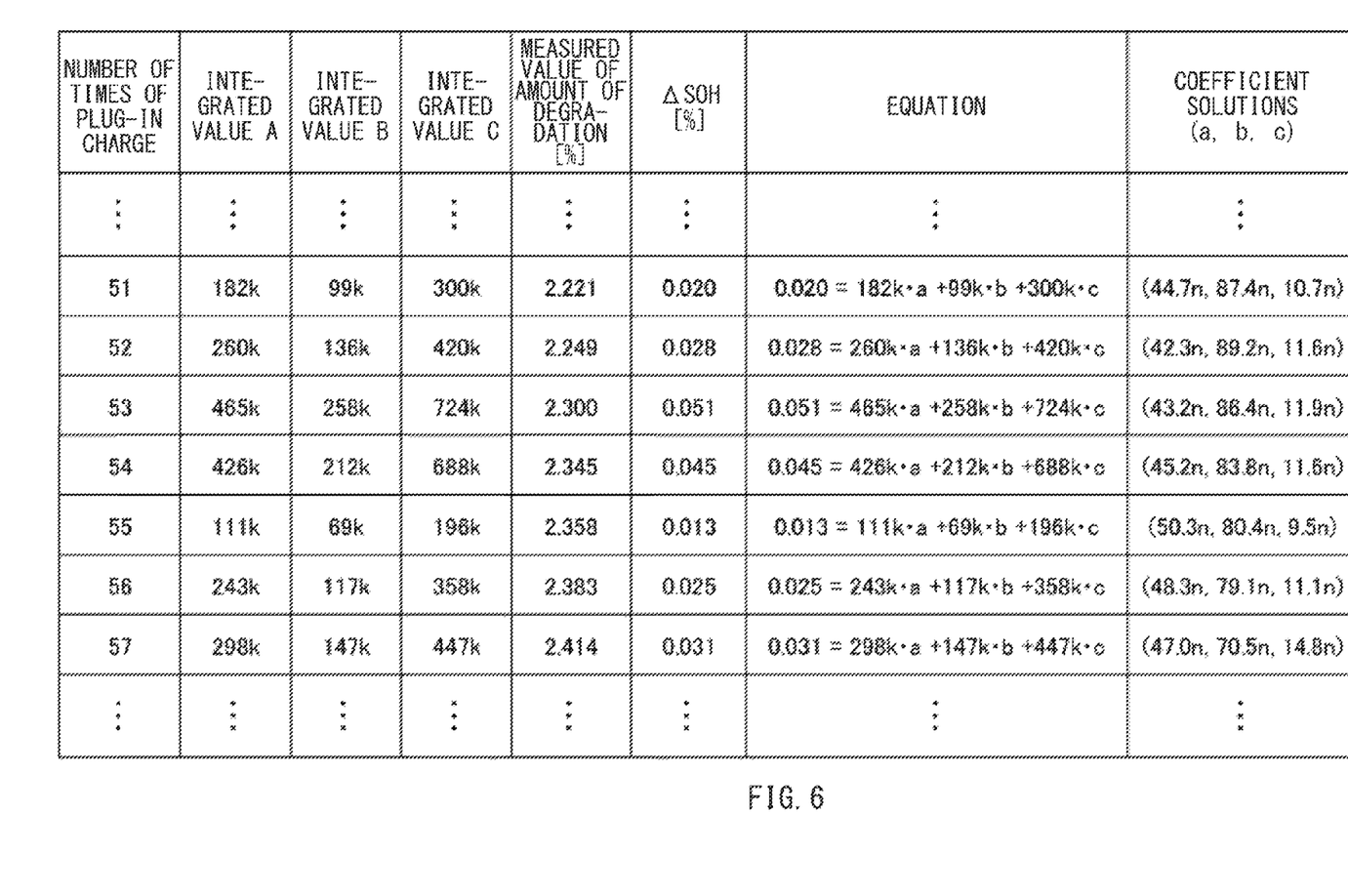
FIG. 6 is a data chart that illustrates data to be handled by the estimation processor at an end of plug-in charge.

FIG. 6 is a data chart that illustrates data processing to be carried out by the estimation processor 13 for each plug-in charge. The data chart is a chart of time-series arrangement of data to be handled by the estimation processor 13 at the end of each plug-in charge. The character "k" in the integrated values A to C means "×1000", and values less than three digits of the integrated values A to C are rounded down. The character "n" in the coefficient solutions means "×10$^{-9}$", and values less than three digits of the coefficient solutions are rounded down.

As described above, at the end of each plug-in charge, the amount of the degradation of the battery 4 may be measured. The estimation processor 13 may store the measured value of the amount of the degradation each time the measurement is made. At the end of the plug-in charge, the estimation processor 13 may calculate a difference between the previously measured value of the amount of the degradation and the currently measured value of the amount of the degradation, to acquire ΔSOH of the battery 4 from the previous measurement to the current measurement. Thus, the estimation processor 13 may apply the integrated values A to C counted from the previous measurement to the current measurement and ΔSOH as mentioned above to the equation (1), to acquire an equation having the weighting coefficients a to c as unknowns. Thus, the equation for each row in FIG. 6 may be obtained by applying ΔSOH and the integrated values A to C in the same row to the equation (1).

Furthermore, at the end of each plug-in charge, the estimation processor 13 may calculate solutions of the weighting coefficients a to c with the use of the obtained equation. Hereinafter, the solutions of the weighting coefficients a to c are referred to as the coefficient solutions. The coefficient solutions may be obtained by, for example, numerical calculation. That is, the estimation processor 13 may allocate several numerical values to each of the weighting coefficients a to c in small increments to find a combination of values that most satisfy the equation. A range of values that the weighting coefficients a to c can take is predetermined as, for example, "0<a<1, 0<b<1, 0<c<1". In a case where the coefficient solutions are not determined by only one equation, the estimation processor 13 may obtain the coefficient solutions of the weighting coefficients a to c by similar numerical calculation with the use of equations obtained on a plurality of occasions close to the time point.

A method of obtaining the coefficient solutions of the weighting coefficients a to c is not limited to the method described above, but various methods may be applied. For example, a method using a machine-learned prediction model may be applied. In this case, a plurality of vehicles including the battery 4 of the same structure may collect a set of data with the use of the same maps of data 12a to 12c. The set of data may include the measured values of the amount of the degradation of the battery 4, the equations of the weighting coefficients a to c, and the coefficient solutions acquired as described above. The collected set of data is given to the prediction model as teacher data, to allow the prediction model to perform machine learning. The prediction model is assumed to be a model that is supplied with the amount of the degradation of the battery 4, or with the amount of the degradation of the battery 4 and each parameter of the equation described above, to output the coefficient solutions of the weighting coefficients a to c that fit the supplied data. The estimation processor 13 may input the measured value of the amount of the degradation acquired at the end of the plug-in charge, or the measured value and each parameter of the equation described above into the prediction model described above, to obtain the coefficient solutions of the weighting coefficients a to c from the prediction model. The prediction model may be provided in the calculation device 10, or alternatively, the prediction model may be provided in a predetermined server computer remote from the vehicle 1. In a case where the prediction model is provided in the server computer, the estimation processor 13 may communicate with the prediction model to obtain the coefficient solutions of the weighting coefficients a to c.

After obtaining the coefficient solutions of the weighting coefficients a to c, the estimation processor 13 may record the coefficient solutions in the storage area 12d. At the same time, the estimation processor 13 may also store the measured value of the amount of the degradation in the storage area 12d. The recording may be made in association with, for example, the measured value of the amount of the degradation at that time point, the event data that indicates the number of times of the end of the plug-in charge, and date and time data.

In some cases, the battery manager 22 is configured to estimate the amount of the degradation of the battery 4, i.e., the SOH, from the relation between the amount of charge and the charging voltage, even in a case where the battery 4 is charged to less than full charge, e.g., the SOC of 80%. Accordingly, the number of times of the plug-in charge in FIG. 6 may include the number of times of the plug-in charge other than full charge. Moreover, in some cases, the battery manager 22 is configured to measure the amount of the degradation of the battery 4, i.e., the SOH, even in a case where the battery 4 is charged with regenerative power. Accordingly, the number of times of the plug-in charge in FIG. 6 may be changed to the number of times of the measurement of the amount of the degradation of the battery 4, and the number of times as mentioned may include the number of times of the measurement of the amount of the degradation of the battery 4 on the occasion of the charge with regenerative power.

<Process of Estimating ΔSOH of Battery>

The estimation processor 13 may constantly count the integrated values A to C. Accordingly, once the values of the weighting coefficients a to c are determined, the estimation processor 13 is able to obtain the estimated value of ΔSOH of the battery 4 with the use of the equation (1). On the other hand, the coefficient solutions obtained from the equation mentioned above may include errors. Thus, the estimation processor 13 may, first, estimate the current, proper weighting coefficients a to c from a plurality of sets of the coefficient solutions previously obtained, instead of estimating ΔSOH with the use of the coefficient solutions of the most recently obtained weighting coefficients a to c. The estimation processor 13 may estimate ΔSOH of the battery 4 from the estimated weighting coefficients a to c and the integrated values A to C.

The estimation of the weighting coefficients a to c may be made as follows. The plurality of sets of the coefficient solutions obtained at different timing should be distributed in the vicinity of the proper weighting coefficients a to c. Accordingly, the estimation processor 13 may calculate a predetermined statistic of each of the weighting coefficients a to c from the plurality of sets of the coefficient solutions acquired at the end of the plug-in charge on the plurality of previous occasions close to the present time. The estimation processor 13 may set the statistics as the estimated values of the weighting coefficients a to c. The predetermined statistic may be an amount representing a value close to a true value from a plurality of values including errors. For example, to the predetermined statistic, a most frequent value may be applied. Alternatively, to the predetermined statistic, for example, an average value may be applied. Any one of the weighting coefficients, for example, the weighting coefficient a, may be calculated with the use of only the coefficient solutions of the weighting coefficient a out of the plurality of sets of the coefficient solutions. Alternatively, the weighting coefficient a may be calculated with the use of the coefficient solutions of all the weighting coefficients a to c. The same applies to the weighting coefficients b and c.

The estimation processor 13 may estimate the weighting coefficients a to c, by similar calculation to the forgoing description, with the use of not only the plurality of sets of the coefficient solutions obtained by the vehicle 1 on which the estimation processor 13 is mounted, but also a plurality of sets of coefficient solutions obtained by another vehicle including the battery 4 of the same structure as the battery 4 of the vehicle 1. In the following, the vehicle 1 on which the estimation processor 13 is mounted is also referred to as the own vehicle 1. In the case of the use of the coefficient solutions obtained by another vehicle, the coefficient solutions obtained by the relevant vehicle may be used when the degree of the degradation of the battery of the relevant vehicle is equivalent to the degree of the degradation of the battery 4 of the own vehicle 1. Making such a choice leads to the estimation of the proper weighting coefficients a to c, while eliminating long-time influences of changes in the weighting coefficients a to c. In the case of the use of the coefficient solutions obtained by another vehicle, each vehicle is configured to transmit the coefficient solutions, the measured value of the amount of the degradation of the battery 4 at that time point, and data that identifies the structure of the battery 4, to a predetermined server computer, each time the coefficient solutions are obtained. In a case where the estimation processor 13 of a certain vehicle estimates the weighting coefficients a to c, the estimation processor 13 may transmit data regarding the amount of the degradation of the battery 4 measured in the past close to the present time to the server computer via communication and download the coefficient solutions by another vehicle from the server computer. It suffices that the coefficient solutions to be downloaded are coefficient solutions obtained when the amount of the degradation of the battery 4 of another vehicle is close to the amount of the degradation transmitted as mentioned above.

At the estimation request for ΔSOH of the battery 4, the estimation processor 13 may estimate the weighting coefficients a to c as described above. The estimation processor 13 may apply the estimated values of the weighting coefficients a to c and the integrated values A to C counted in a period corresponding to the estimation request for ΔSOH to the equation (1), to calculate ΔSOH of the battery 4 in the relevant period. The estimation processor 13 may assume the obtained value to be the estimated value of ΔSOH, i.e., the amount of change in the degradation, in the relevant period.

<Utilization of Estimated ΔSOH>

Effective utilization ΔSOH for any period estimated as described above may be made as follows. For example, in a case where the vehicle 1 is used for car sharing or car lease, the estimation processor 13 may estimate ΔSOH for a period from a start of lease of the vehicle 1 to an end of the lease of the vehicle 1. Such estimation makes it possible to estimate ΔSOH of the battery 4 generated during the lease of the vehicle 1, without performing the plug-in charge on the occasion of the return of the vehicle 1. It is also possible to decide a rent in consideration of ΔSOH.

Moreover, during the use of the vehicle 1, the estimation processor 13 may estimate ΔSOH constantly or in accordance with, for example, an operation by a user, and provide the user with the current amount of the degradation of the battery 4, i.e., the SOH. For example, the estimation processor 13 may provide the user with a display output thereof. It is possible to obtain the current amount of the degradation of the battery 4 by adding the estimated ΔSOH to the previously measured amount of the degradation. Such estimation and data provision makes it possible for the user to check the amount of the degradation of the battery 4 seamlessly or at desired timing.

Moreover, the estimation processor 13 may provide the user with the estimated weighting coefficients a to c. For example, the estimation processor 13 may provide the user with a display output thereof. Standardizing the degrees of the degradation in the plurality of the maps of data 12a to 12c makes it possible to indicate which of the maps of data 12a to 12c includes the degree of the degradation having large influences on the amount of the degradation of the battery 4, with the use of the values of the weighting coefficients a to c. That is, in a case where the weighting coefficient a is greater than the weighting coefficients b and c, the user can understand that deviations of the current and the voltage from standard values are greatly affecting the degradation of the battery 4. In a case where the weighting coefficient b is greater than the weighting coefficients a and c, the user can expect that deviations of the temperature and the current from standard values are greatly affecting the degradation of the battery 4. In a case where the weighting coefficients a and c are large and the weighting coefficient b is small, the user can expect that deviation of the voltage, i.e., a common parameter to the maps of data 12a and 12c, from the standard value is greatly affecting the degradation of the battery 4. Thus, with the expectation as mentioned above, the user can adopt the usage of the battery 4 for suppression of the degradation of the battery 4. For example, the user can adopt the usage of the battery 4 in which a charging rate is kept within a predetermined range, to bring the voltage close to the standard value. In this way, it is possible to suppress the degradation of the battery 4.

<Control Processing in Estimation Processor>

Figure 7:
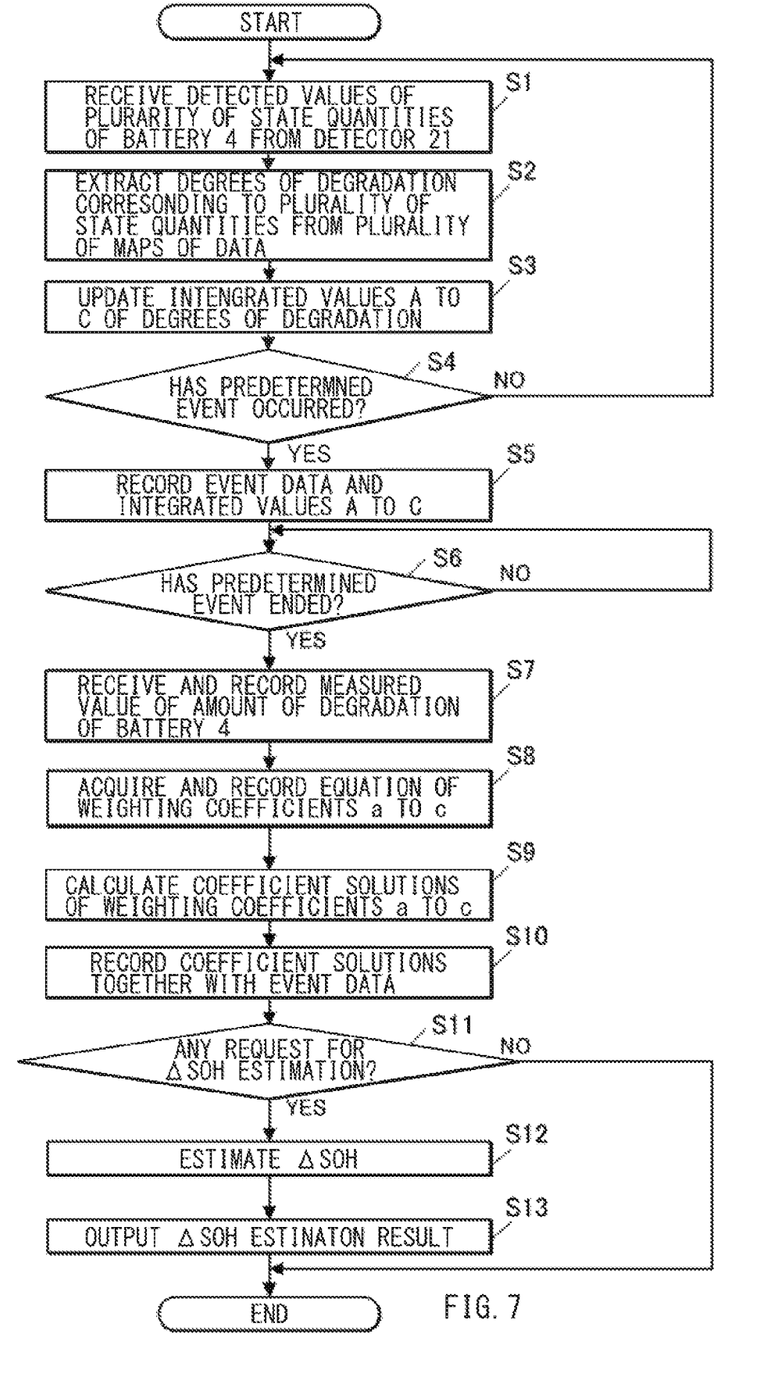
FIG. 7 is a flowchart of an example of control processing to be carried out by the estimation processor.

Description now moves on to control processing in the estimation processor 13 to realize the ΔSOH estimation as described. FIG. 7 is a flowchart that illustrates an example of the control processing to be carried out by the estimation processor. The estimation processor 13 may constantly and repetitively carry out the control processing in FIG. 7. At a start of the control processing, first, the estimation processor 13 may receive the detection values of the plurality of the state quantities that indicates the state of use of the battery 4 from the battery manager 22 (step S1). The plurality of the state quantities may include, without limitation, the current, the voltage, and the temperature of the battery 4. The detection values are the values detected by the detector 21.

Upon receiving the detected values of the plurality of the state quantities, the estimation processor 13 may compare the detected values of the state quantities with the plurality of maps of data 12a to 12c and extract the degrees of the degradation of the battery 4 corresponding to the detected values (step S2). The estimation processor 13 may add the extracted degrees of the degradation to the integrated values A to C (see FIG. 5) and update the integrated values A to C (step S3).

Thereafter, the estimation processor 13 may determine whether a predetermined event has occurred (step S4). In negation (NO), the estimation processor 13 may cause the flow to return to step S1. That is, in a period in which the determination in step S4 results in negation (NO), the processes of steps S1 to S3 are repetitively carried out on predetermined control cycles of, for example, 0.1 ms to 100 ms.

In a case where the determination in step S4 result in affirmation (YES), the integrated values A to C at that time point may be recorded in the storage area 12d as a log together with the event data (step S5). Here, the plug-in charge is adopted as the predetermined event. It is to be noted that recording of the event data and the integrated values A to C may be carried out not only on the occasion of the occurrence of the event but also at the end of the event. Moreover, on the occasion of occurrence of any other event and at an end of the event, the estimation processor 13 may record the event data and the integrated values A to C. Non-limiting examples of other events may include the lease of the vehicle. In this case, it suffices that the event data and the integrated values A to C are recorded on the occasion of a notification of the start of the lease and on the occasion of a notification of the end of the lease. In addition, the estimation processor 13 may record the integrated values A to C updated on predetermined control cycles or every predetermined time in the storage area 12d as the log. The integrated values A to C may be reset after recording in step S5.

Thereafter, the estimation processor 13 may determine whether the predetermined event has ended (step S6). In a case where the predetermined event has not ended, the estimation processor 13 may repeat the determination in step S6. In a case where the predetermined event has ended, the estimation processor 13 may cause the flow to a subsequent step. It is to be noted that in the period in which the determination in step S6 is repetitively made, the processes of steps S1 to S3 may be repetitively carried out on the predetermined control cycles.

Thereafter, in a case where the determination in step S6 results in affirmation (YES), the estimation processor 13 may receive the measured value of the amount of the degradation of the battery 4 from the battery manager 22, and record the measured value in the storage area 12d as the log (step S7). In a case where the plug-in charge ends at full charge, the battery manager 22 may acquire the ratio of the charging capacity at full charge to the initial full charge capacity of the battery 4, as the measured value of the amount of the degradation. Furthermore, even in a case where the plug-in charge ends less than the full charge, the battery manager 22 may estimate the full charge capacity of the battery 4 and the amount of the degradation of the battery 4 on the basis of the relation between an amount of charge on the occasion of the relevant plug-in charge and the voltage of the battery 4, and acquire the estimated amount of the degradation as the measured value.

Furthermore, the estimation processor 13 may acquire the equation (see FIG. 6) to obtain the weighting coefficients a to c on the basis of the measured value of the amount of the degradation received in step S7 and the integrated values A to C, and record the equation in the storage area 12d as the log (step S8). In one example, the estimation processor 13 may acquire the equation described above, on the basis of the difference between the measured value of the amount of the degradation described above and the measured value of the amount of the degradation recorded at the end of the previous plug-in charge, and the integrated values A to C at the time point.

Furthermore, the estimation processor 13 may calculate the coefficient solutions of the weighting coefficients a to c with the use of the equation in step S8 or the equations previously recorded on a plurality of occasions up to the present time (step S9). In step S9, the estimation processor 13 may allocate several numerical values to each of the weighting coefficients a to c in small increments within the range of values that the weighting coefficients a to c can take, e.g., "$0<a<1, 0<b<1, 0<c<1$", and find, by numerical processing, the combination of values that most satisfy the equation. Upon obtaining the coefficient solutions, the estimation processor 13 may record the coefficient solutions in the storage area 12d together with the recording of the event data (step S10).

Thereafter, the estimation processor 13 may determine whether there is any request for the estimation of ΔSOH of the battery 4 (step S11). There is no particular limitation on the transmission of the request for the estimation, but the request may be transmitted from, for example, the controller 9 to the calculation device 10. The controller 9 may serve as a user interface of the vehicle 1. The request for the estimation may be made by designating start timing and end timing of ΔSOH. The end timing may be fixed at the present time.

In a case where the determination in step S11 results in negation (NO), the estimation processor 13 may end the control processing for one control cycle. In affirmation (YES), the estimation processor 13 may estimate ΔSOH of the battery 4 from the start timing designated in the request for the estimation to the present time, or from the start timing to the end timing designated in the request for the estimation (step S12). In step S12, the estimation processor 13 may estimate the proper weighting coefficients a to c on the basis of statistical processing. For example, the estimation processor 13 may extract a plurality of sets of the coefficient solutions close to the present time from the log of the coefficient solutions of the weighting coefficients a to c, and adopt most frequent values as the estimated values of the weighting coefficients a to c. Thereafter, the estimation processor 13 may apply the integrated values A to C from the start timing to the end timing designated in the request for the estimation and the estimated weighting coefficients a to c to the equation (1) as mentioned above. In this way, the estimation processor 13 may calculate ΔSOH of the battery 4.

Upon estimating ΔSOH, the estimation processor 13 may transmit a result of the calculation to the controller 9 that has made the request (step S13). The controller 9 may output the estimated value of ΔSOH thus received to the display panel 8 of the vehicle 1. Thus, the estimation processor 13 may end the control processing for one time.

In the flowchart in FIG. 7, on the condition that the predetermined event has ended (YES in step S6), the estimation processor 13 may carry out the process of step S11 to determine presence or absence of the request for the ΔSOH estimation. However, the estimation processor 13 may receive the request for the ΔSOH estimation at other timing and carry out the processes of steps S12 and S13. For example, the estimation processor 13 may be configured to repetitively carry out the processes of steps S11 to S13 separately from the processes of steps S1 to S11 in parallel with the processes of steps S1 to S11.

In the control processing in FIG. 7, carrying out the processes of steps S1 to S3 repetitively makes it possible to realize the counting process of the integrated values A to C as described above. Furthermore, carrying out the processes of steps S7 to S10 allows for the acquisition of the equation and the coefficient solutions of the weighting coefficients a to c on the occasion of the measurement of the amount of the degradation.

The program of the control processing described above may be held in a non-transitory computer readable medium such as the ROM 10c of the calculation device 10. The calculation device 10 may be configured to read the program held in a portable non-transitory computer readable medium and execute the program. The portable non-transitory computer readable medium as mentioned above may hold the program of the control processing.

As described, according to the degraded state estimation apparatus 100 of this embodiment, the estimation processor 13 is configured to estimate ΔSOH of the battery 4 on the basis of the plurality of the state quantities of the battery 4 repetitively detected by the detector 21, the plurality of the maps of data 12a to 12c, and the plurality of the weighting coefficients a to c. The degradation of the battery 4 progresses in accordance with the plurality of the state quantities that indicates the state of use of the battery 4, e.g., the current, the voltage, and the temperature. However, influences on the amount of the degradation are not exerted by each of the state quantities independently. Instead, a degree of the influences on the amount of the degradation varies with a combination of the plurality of the state quantities. Accordingly, in the degraded state estimation apparatus 100 of this embodiment, the plurality of the maps of data 12a to 12c includes the map data that indicates the degrees of the degradation corresponding to the first state quantity and the second state quantity, and the map data that indicates the degrees of the degradation corresponding to the second state quantity and the third state quantity. With such maps of data, it is possible to obtain the degree of the degradation that reflects the degradation caused for the battery 4 by the combination of the first state quantity and the second state quantity, and the degradation caused for the battery 4 by the combination of the second state quantity and the third state quantity. Hence, it is possible to enhance estimation accuracy of ΔSOH of the battery 4.

Furthermore, according to the degraded state estimation apparatus 100 of this embodiment, the estimation processor 13 may obtain the degrees of the degradation extracted from the respective ones of the plurality of the maps of data 12a to 12c on the basis of the detection results of the plurality of the state quantities of the battery 4 by the detector 21, to count the integrated values A to C. The estimation processor 13 may estimate ΔSOH of the battery 4 on the basis of the integrated values A to C and the weighting coefficients a to c. As described, the degrees of the degradation in the maps of data 12a to 12c may be accumulated on the basis of the detection by the detector 21. Thus, the integrated values A to C reflect the degrees of the degradation that reflect the state of use of the battery 4 on the occasion of each detection. This leads to further enhancement of the estimation accuracy of ΔSOH of the battery 4.

Furthermore, according to the degraded state estimation apparatus 100 of this embodiment, each time the measured value of the amount of the degradation of the battery 4 is acquired, the estimation processor 13 may calculate the coefficient solutions of the weighting coefficients a to c from the equation of the weighting coefficients a to c acquired on the basis of the integrated values A to C and the measured value of the amount of the degradation. Furthermore, the estimation processor 13 may estimate the weighting coefficients a to c to be used to estimate ΔSOH, on the basis of the coefficient solutions previously calculated. Even in the case where a plurality of factors of the battery 4, e.g., the combination of the current, the voltage, and the temperature, influences the amount of the degradation of the battery 4, weighting of the degree to which the plurality of the factors influences the amount of the degradation may sometimes change gradually. Thus, in this embodiment, estimating the weighting coefficients a to c as described above makes it possible to set the proper weighting coefficients a to c, to cope with the case where the weighting of the degree to which the plurality of the factors influences the amount of the degradation changes gradually. This leads to further enhancement of the estimation accuracy of ΔSOH of the battery 4.

Furthermore, according to the degraded state estimation apparatus 100 of this embodiment, the weighting coefficients a to c to be used to estimate ΔSOH may be estimated on the basis of the sets of the coefficient solutions of the weighting coefficients a to c previously calculated on a plurality of occasions. Alternatively, the coefficient solutions of the weighting coefficients a to c to be used to estimate ΔSOH may be estimated in additional consideration of the sets of the weighting coefficients a to c calculated by another vehicle. Thus, even in a case with relatively large errors in the coefficient solutions calculated each time, it is possible to calculate the weighting coefficients a to c with small errors. This leads to further enhancement of the estimation accuracy of ΔSOH of the battery 4.

Furthermore, according to the degraded state estimation apparatus 100 of this embodiment, the plurality of the maps of data 12a to 12c may further include the map of data that indicates the degrees of the degradation corresponding to the third state quantity and the first state quantity. Hence, it is possible to make the ΔSOH estimation that reflects the influences of the degree of the degradation caused for the battery 4 by the combination of the third state quantity and the first state quantity. This leads to the further enhancement of the estimation accuracy of ΔSOH of the battery 4.

Although some example embodiments of the technology have been described in the forgoing by way of example with reference to the accompanying drawings, the technology is by no means limited to the example embodiments described above. It should be appreciated that modifications and alterations may be made by persons skilled in the art without departing from the scope as defined by the appended claims. The use of the terms first, second, etc. does not denote any order or importance, but rather the terms first, second, etc. are used to distinguish one element from another. The technology is intended to include such modifications and alterations in so far as they fall within the scope of the appended claims or the equivalents thereof.

For example, in the forgoing embodiments, the current, the voltage, and the temperature of the battery 4 are given as examples of the plurality of the state quantities that indicates the state of use of the battery 4, but this is non-limiting. The plurality of the state quantities may additionally include the SOC of the battery 4. Alternatively, the voltage may be replaced with the SOC.

Moreover, in the forgoing embodiments, the example is given in which the plurality of the maps of data includes the IV map of data 12a, the TI map of data 12b, and the TV map of data 12c, but the plurality of the maps of data is not limited thereto. For example, the plurality of the maps of data may additionally include a map of data that indicates the degrees of the degradation corresponding to the single state quantity, or a map of data that indicates the degrees of the degradation corresponding to three or more state quantities. Moreover, any one of the maps of data 12a to 12c may be omitted. In this case, the plurality of the maps of data may include only two kinds of the maps of data that indicate the degrees of the degradation corresponding to two state quantities.

Other details described in the forgoing example embodiments may be changed as appropriate within the scope of the technology.

According to the aspects of the technology, a degraded state estimation apparatus includes an estimation processor configured to estimate an amount of change in degradation of a battery. Hence, it is possible to estimate the amount of change in the degradation of the battery after using the battery and before charging of the battery. The degradation of the battery progresses in accordance with a plurality of state quantities that indicate a state of use of the battery. However, influences on an amount of degradation are not exerted by each of the state quantities independently. Instead, a degree of the influences on the amount of the degradation varies with a combination of the plurality of the state quantities. Accordingly, in the degraded state estimation apparatus of the aspects of the technology, a first map of data and a second map of data are provided. The first map of data indicates the degrees of the degradation of the battery corresponding to a first state quantity and a second state quantity. The second map of data indicates the degrees of the degradation of the battery corresponding to the second state quantity and a third state quantity. The estimation processor is configured to estimate the amount of change in the degradation with the use of a plurality of maps of data including the first map of data and the second map of data. Hence, it is possible to estimate the amount of change in the degradation that reflects a degree of the degradation caused by a combination of the first state quantity and the second state quantity based on the first map of data, and a degree of the degradation caused by a combination of the second state quantity and the third state quantity based on the second map of data. Hence, it is possible to enhance estimation accuracy of a degraded state of the battery.

Furthermore, the estimation processor may estimate the amount of change in the degradation of the battery with the use of a plurality of weighting coefficients. The plurality of the weighting coefficients weights the degrees of the degradation indicated by respective ones of the plurality of the maps of data. Accordingly, it is possible to standardize, in each of the maps of data, the degrees of the degradation indicated by the plurality of the maps of data. This leads to adjustment of weighting of the degrees of the degradation between the plurality of the maps of data, by the weighting coefficients. Hence, it is possible to create each of the maps of data more easily.

The estimation processor 13 illustrated in FIG. 2 is implementable by circuitry including at least one semiconductor integrated circuit such as at least one processor (e.g., a central processing unit (CPU)), at least one application specific integrated circuit (ASIC), and/or at least one field programmable gate array (FPGA). At least one processor is configurable, by reading instructions from at least one machine readable non-transitory tangible medium, to perform all or a part of functions of the estimation processor 13 illustrated in FIG. 2. Such a medium may take many forms, including, but not limited to, any type of magnetic medium such as a hard disk, any type of optical medium such as a CD and a DVD, any type of semiconductor memory (i.e., semiconductor circuit) such as a volatile memory and a non-volatile memory. The volatile memory may include a DRAM and a SRAM, and the nonvolatile memory may include a ROM and a NVRAM. The ASIC is an integrated circuit (IC) customized to perform, and the FPGA is an integrated circuit designed to be configured after manufacturing in order to perform, all or a part of the functions of the estimation processor 13 illustrated in FIG. 2.

The invention claimed is:

1. A degraded state estimation apparatus for a battery mounted on a vehicle, the degraded state estimation apparatus being configured to estimate a degraded state of the battery for travel of the vehicle, the degraded state estimation apparatus comprising:
 a detector configured to detect a first state quantity, a second state quantity, and a third state quantity, each of which corresponds to either current of the battery, voltage of the battery, or temperature of the battery;
 a storage configured to hold (1) a first map including first degrees of degradation of the battery, one of which is selected by the detected first state quantity and second state quantity, and (2) a second map including second degrees of the degradation of the battery, one of which is selected by the detected second state quantity and third state quantity; and
 an estimation processor configured to:
  obtain ones of the first degrees of the degradation obtained from the first map in response to the detector repeatedly detecting the first state quantity and the second state quantity, and obtain ones of the second degrees of the degradation obtained from the second map in response to the detector repeatedly detecting the second state quantity and the third state quantity;
  obtain a first integrated value of the ones of the first degrees of the degradation obtained from the first map, and obtain a second integrated value of the ones of the second degrees of the degradation obtained from the second map;
  weight the first integrated value based on a first weighting coefficient, and weight the second integrated value based on a second weighting coefficient; and
  estimate an amount of change in the degradation of the battery based on the weighted first integrated value and the weighted second integrated value.

2. The degraded state estimation apparatus for the battery according to claim 1, wherein the estimation processor is configured to:
 acquire a measured value of an amount of the degradation of the battery on an occasion of charge of the battery; and
 calculate coefficient solutions based on a difference between a previously acquired measured value and a currently acquired measured value, and the first and second integrated values, and
 in estimating the amount of change in the degradation, estimate, based on the coefficient solutions previously calculated, the first and second weighting coefficients to be used to estimate the amount of change in the degradation.

3. The degraded state estimation apparatus for the battery according to claim 2, wherein
 the estimation processor is configured to estimate the weighting coefficients to be used to estimate the amount of change in the degradation, on a basis of sets of the coefficient solutions, and
 the sets of the coefficient solutions include two or more sets out of: sets of the coefficient solutions calculated on a plurality of occasions on a basis of measured values acquired on a plurality of previous occasions; and sets of the coefficient solutions calculated by another vehicle on a plurality of occasions on a basis of the measured values acquired on a plurality of previous occasions.

4. The degraded state estimation apparatus for the battery according to claim 3, wherein
 the storage is further configured to hold a third map including third degrees of the degradation of the battery, one of which is selected by the detected third state quantity and the detected first state quantity, and
 the estimation processor is further configured to:
  obtain ones of the third degrees of the degradation from the third map in response to the detector repeatedly detecting the third state quantity and the first state quantity;
  obtain a third integrated value of the ones of the third degrees of the degradation obtained from the third map;
  weight the third integrated value based on a third weighting coefficient; and
  estimate the amount of change in the degradation of the battery based on the weighted first integrated value, the weighted second integrated value, and the weighted third integrated value.

5. The degraded state estimation apparatus for the battery according to claim 3, wherein
 the storage is further configured to hold a third map including third degrees of the degradation of the battery, one of which is selected by the detected third state quantity and the detected first state quantity, and
 the estimation processor is further configured to:
  obtain ones of the third degrees of the degradation from the third map in response to the detector repeatedly detecting the third state quantity and the first state quantity;

obtain a third integrated value of the ones of the third degrees of the degradation obtained from the third map;

weight the third integrated value based on a third weighting coefficient; and estimate the amount of change in the degradation of the battery based on the weighted first integrated value, the weighted second integrated value, and the weighted third integrated value.

6. The degraded state estimation apparatus for the battery according to claim 1, wherein the storage is further configured to hold a third map including third degrees of the degradation of the battery, one of which is selected by the detected third state quantity and the detected first state quantity, and the estimation processor is further configured to:

obtain ones of the third degrees of the degradation from the third map in response to the detector repeatedly detecting the third state quantity and the first state quantity;

obtain a third integrated value of the ones of the third degrees of the degradation obtained from the third map;

weight the third integrated value based on a third weighting coefficient; and estimate the amount of change in the degradation of the battery based on the weighted first integrated value, the weighted second integrated value, and the weighted third integrated value.

7. A degraded state estimation apparatus for a battery mounted on a vehicle, the degraded state estimation apparatus being configured to estimate a degraded state of the battery for travel of the vehicle, the degraded state estimation apparatus comprising:

a detector configured to detect a first state quantity, a second state quantity, and a third state quantity, each of which corresponds to either current of the battery, voltage of the battery, or temperature of the battery;

a storage configured to hold (1) a first map including first degrees of degradation of the battery, one of which is selected by the detected first state quantity and second state quantity, and (2) a second map including second degrees of the degradation of the battery, one of which is selected by the detected second state quantity and third state quantity; and circuitry configured to:

obtain ones of the first degrees of the degradation obtained from the first map in response to the detector repeatedly detecting the first state quantity and the second state quantity, and obtain ones of the second degrees of the degradation obtained from the second map in response to the detector repeatedly detecting the second state quantity and the third state quantity;

obtain a first integrated value of the ones of the first degrees of the degradation obtained from the first map, and obtain a second integrated value of the ones of the second degrees of the degradation obtained from the second map;

weight the first integrated value based on a first weighting coefficient, and weight the second integrated value based on a second weighting coefficient; and estimate an amount of change in the degradation of the battery based on the weighted first integrated value and the weighted second integrated value, wherein.

8. A degraded state estimation apparatus for a battery mounted on a vehicle, the degraded state estimation apparatus being configured to estimate a degraded state of the battery for travel of the vehicle, the degraded state estimation apparatus comprising:

a voltage sensor configured to detect voltage of the battery;

a current sensor configured to detect current of the battery;

a temperature sensor configured to detect temperature of the battery;

a storage configured to hold (1) a first map indicating first degrees of degradation of the battery per a predetermined time, one of which is selected by the detected voltage and the detected current of the battery, (2) a second map indicating second degrees of degradation of the battery per the predetermined time, one of which is selected by the detected current and the detected temperature of the battery, and (3) a third map indicating third degrees of degradation of the battery per the predetermined time, one of which is selected by the detected voltage and the detected temperature of the battery; and circuitry configured to:

execute, from a first timing to a second timing, an obtaining process every the predetermined time, wherein a period of time between the first timing and the second timing is longer than the predetermined time, and wherein, in the obtaining process, the circuitry is configured to (1) obtain one of the first degrees of the degradation from the first map based on latest detected voltage and latest detected current of the battery, (2) obtain one of the second degrees of the degradation from the second map based on latest detected current and latest detected temperature of the battery, and (3) obtain one of the third degrees of the degradation from the third map based on latest detected voltage and latest detected temperature of the battery;

calculate, after the second timing, (1) a first integrated value by integrating the first degrees of the degradation obtained by executing the obtaining process from the first timing to the second timing, (2) a second integrated value by integrating the second degrees of the degradation obtained by executing the obtaining process from the first timing to the second timing, and (3) a third integrated value by integrating the third degrees of the degradation obtained by executing the obtaining process from the first timing to the second timing;

weight the first integrated value based on a first weighting coefficient, weight the second integrated value based on a second weighting coefficient, and weight the third integrated value based on a third weighting coefficient; and calculate an amount of change in the degradation of the battery from the first timing to the second timing by adding the weighted first integrated value, the weighted second integrated value and the weighted third integrated value.

9. The degraded state estimation apparatus for the battery according to claim 8, wherein the circuitry is configured to:

acquire a measured value of an amount of the degradation of the battery when the battery is being charged via a plug-in; and calculate coefficient solutions based on a difference between a previously acquired measured value and a currently acquired measured value, and the first, second and third integrated values, and in calculating the amount of change in the degradation, calculate, based on the coefficient solutions previously calculated, the first, second and third weighting coefficients to be used to estimate the amount of change in the degradation.

* * * * *